FABRICATION OF THERMOELECTRIC APPARATUS

Filed Sept. 10, 1962

William H. Clingman,
Foster L. Gray,
James F. Haefling,
Barry R. West,
Inventors.

Koenig, Pope, Senniger & Powers,
Attorneys.

United States Patent Office 3,261,079
Patented July 19, 1966

3,261,079

FABRICATION OF THERMOELECTRIC APPARATUS

William H. Clingman, Jr., and Foster L. Gray, Dallas, James F. Haefling, Garland, and Barry R. West, Dallas, Tex., assignors to Texas Instruments Incorporated, Dallas, Tex., a corporation of Delaware Filed Sept. 10, 1962, Ser. No. 222,310
2 Claims. (Cl. 29—155.5)

Figures 1, 2, 3, 4, 5, 6:
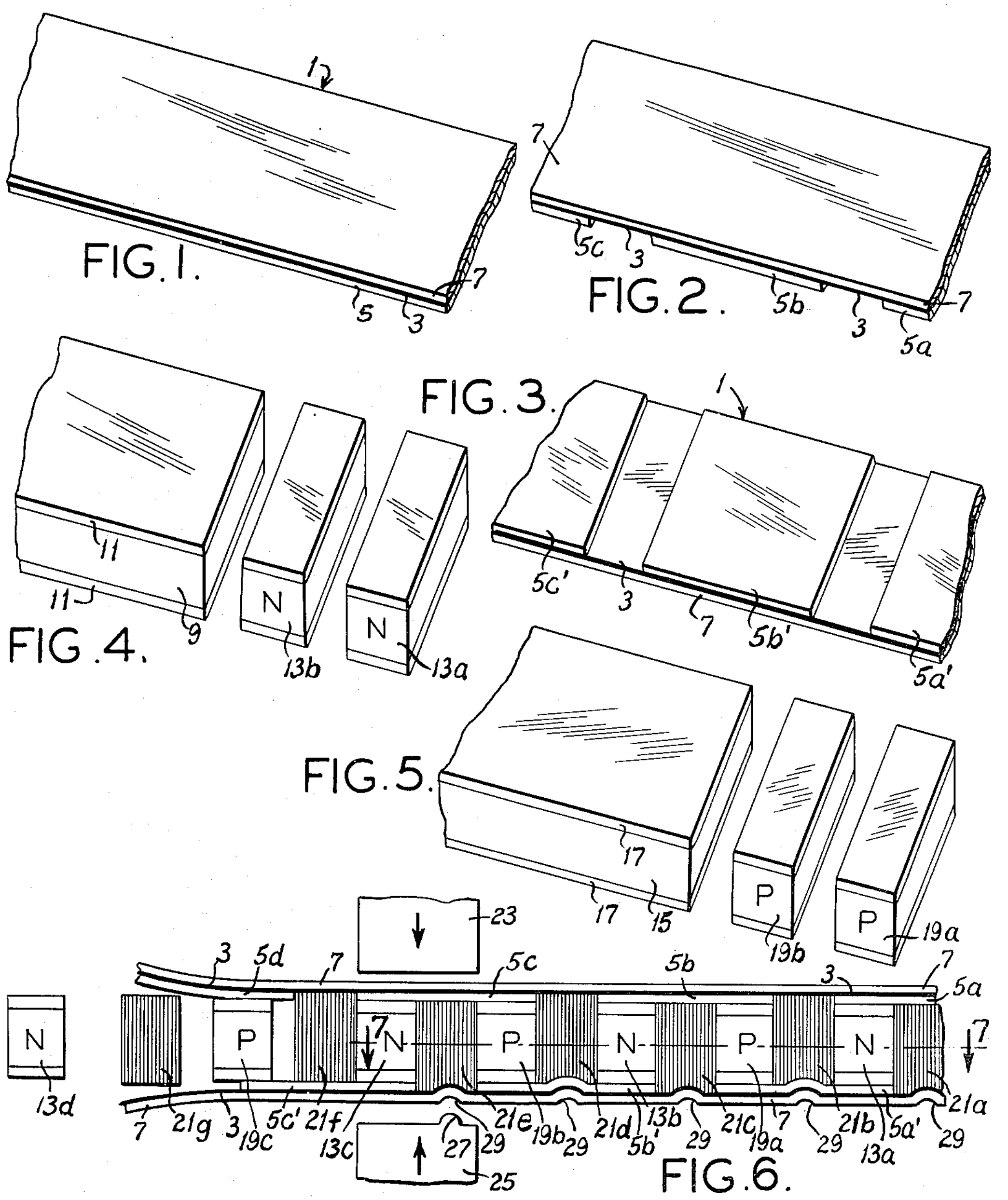

This invention relates to the fabrication of thermoelectric apparatus, and more particularly to an improved method of fabricating thermoelectric modules having advantageous thermal and electrical characteristics.

In the fabrication of thermoelectric devices, such as thermoelectric generators or thermoelectric heating or cooling apparatus, each thermoelement, i.e., each leg or segment of thermoelectric material, must be soldered or otherwise individually attached to an electrically conductive contact. Thereafter, the resulting thermoelements must be interconnected electrically and enclosed within a casing to form a thermoelectric module. The term thermoelectric module, as used herein, refers to any unit or component which exhibits a thermoelectric or thermocouple effect and which may be employed in thermoelectric apparatus. According to the present technology, the above-mentioned assembly steps are performed manually, resulting not only in thermoelectric devices which are quite costly, but also in such devices which, in many instances, exhibit inferior electrical and thermal properties. The present invention is directed to a method of fabricating thermoelectric modules which may be readily carried out using automatic machine methods and which therefore may be efficiently and inexpensively performed. This invention is also directed to the resulting improved thermoelectric modules themselves.

Among the several objects of this invention may be noted the provision of a method of fabricating thermoelectric modules which employs metallurgical techniques amenable to automatic machine operation; the provision of such a method of fabrication which renders practical the construction of large thermoelectric generators and other thermoelectric apparatus; the provision of a method of fabricating thermoelectric apparatus which reduces the number of steps and piece parts required in assembly; the provision of a thermoelectric module fabrication process in which the dimensions of the various components may be easily varied to meet the requirements of different applications; the provision of the method of fabricating thermoelectric modules having improved thermal and electrical characteristics; the provision of thermoelectric modules in which the thermal conductance between various components which are required to be electrically insulated is enhanced; and the provision of such modules which are rugged, reliable, and relatively inexpensive. Other objects and features will be in part apparent and in part pointed out hereinafter.

Briefly, the method of this invention comprises forming first and second assemblies each having a plurality of spaced substantially coplanar electrically insulated conductive plates. In the specific embodiment of the invention disclosed herein, each of these assemblies is formed by bonding a layer of electrical insulating material between two sheets of conductive material and then removing portions of one of the conductive sheets to form the individual spaced conductive plates. The method of this invention further includes the steps of positioning these assemblies substantially parallel to one another with the conductive plates in facing relationship; then forming a plurality of thermoelements each having opposed surface portions of conductive material and an intermediate portion of thermoelectric material; and finally interposing these thermoelements between the assemblies with the conductive portions of each thermoelement directly contacting opposed conductive plates so that the thermoelectric elements are electrically interconnected to form a thermoelectric module.

The invention accordingly comprises the products and methods hereinafter described, the scope of the invention being indicated in the following claims.

Figure 7:
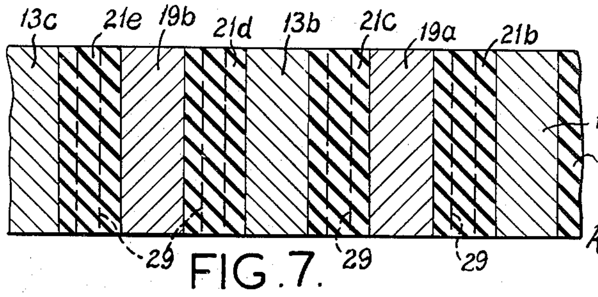

In the accompanying drawings in which one of various possible embodiments of the invention is illustrated, FIGURES 1–3 illustrate the steps involved in the fabrication of the outer casing assemblies of a thermoelectric module;

FIGURES 4 and 5 illustrate the steps involved in forming the thermoelement components of this module; and FIGURES 6 and 7 illustrate the final assembly step, FIGURE 7 being a cross section taken on line 7—7 in FIGURE 6.

Corresponding reference characters indicate corresponding parts throughout the drawings.

Referring now to the drawings, the first step, the fabrication of the outer or exterior assemblies which form the casings of the completed thermoelectric module, is illustrated in FIGURES 1–3. A conductor-insulator-conductor sheet 1 is prepared by bonding a thin extensive layer of insulating material 3 between two sheets of electrically conductive material 5 and 7. Layer 3 may be any suitable insulating material, for example, ceramic. Next, portions of conductive sheet 5 are removed, for example, by milling or by etching, to form an assembly having a plurality of spaced apart substantially coplanar conductive areas or plates *5a*, *5b*, *5c*, etc. This assembly is illustrated in FIGURE 2. A similar assembly formed from laminated conductor-insulator-conductor sheet 1 and having spaced substantially coplanar conductive plates *5a'*, *5b'*, *5c'*, etc. is illustrated in FIGURE 3. As will be explained hereinafter, the assembly illustrated in FIGURE 2 will constitute the top casing of the assembled thermoelectric module, while the assembly illustrated in FIGURE 3 will constitute the bottom casing of this module. In the specific embodiment disclosed herein, all of the conductive plates *5a*, *5b*, . . . *5a'*, *5b'*, . . . are the same size. Insulating layer 3 insures that these plates are electrically insulated both from each other and from conductive sheets 7. Because of the mechanical bonding operation, the thermal resistance between these various plates and the conductive sheets 7 is minimized.

The next step in the module fabrication process of this invention consists in forming or prefabricating the individual thermoelements. This step is illustrated in FIGURES 4 and 5. Referring to FIGURE 4 which illustrates the forming of n-type thermoelements, a sheet of n-type thermoelectric semiconductor material 9, for example, lead telluride (PbTe) doped with iodine, is clad on both sides with electrically conductive material 11. This conductive material should be chosen as to avoid undesirable diffusion with thermoelectric material which might have a deteriorating effect on the properties of this thermoelectric material. That is, the contact material must be compatible with the specific n-type thermoelectric material chosen. A conductive material suitable for use with lead telluride is nickel. Contact material 11 may be bonded to the thermoelectric material either by pressing or by a rolling process. This results in a metallurgical bond of low electrical resistance and high mechanical strength between the contact material and the semiconductor material. The resulting clad structure is then cut or segmented to form a plurality of individual n-type thermoelements *13a*, *13b*, etc.

The forming or prefabrication of individual p-type thermoelements is illustrated in FIGURE 5. The steps involved in this phase of the process are identical to those employed in forming the n-type thermoelements, except in FIGURE 5 a sheet of p-type thermoelectric semiconductor material 15, for example, lead telluride (PbTe) doped with sodium, is clad on both sides with a suitable compatible conductive material 17, for example, nickel. The resulting metal clad sheet is then segmented to form the individual p-type thermoelements 19*a*, 19*b*, etc. Again the metallurgical bond between the thermoelectric material and the conductive contact portions of the thermoelements insures low electrical resistance and high mechanical strength therebetween.

The final or assembly step of the process is illustrated in FIGURES 6 and 7. Prior to this step, individual blocks of insulating material 21*a*, 21*b*, 21*c*. . . . are formed by any suitable method. For example, these blocks may be cut from sheets of compacted potassium-titanate; or they may be formed from asbestos fibers bonded together by organic binders (such a material is commercially available under the trade designation "MIN–K). Blocks 21*a*, 21*b*, etc. have a vertical dimension (as viewed in FIGURE 6) which is equal or nearly equal to the vertical dimension of the thermoelements 13*a*, 13*b* . . . 19*a*, 19*b* . . . plus the thickness of conductive plate 5*a*, 5*b* . . . . The lateral dimension of the blocks must be sufficient to provide the proper amount of insulation between adjacent thermoelements.

Referring now to FIGURES 6 and 7, the final assembly step comprises positioning the casing assemblies illustrated in FIGURES 2 and 3 substantially parallel to one another with plates 5*a*, 5*b* . . . in facing relationship with plates 5*a'*, 5*b'* . . . and with the plates of the upper assembly offset with respect to those in the lower assembly. The n-type and p-type thermoelements with their opposed upper and lower conductive surfaces are alternately fed between the upper and lower casing assemblies. The blocks of insulating material 21*a*, 21*b* are also sequentially fed between the upper and lower casing assemblies, one between each of the thermoelements. The thermoelements and the insulated blocks are then bonded between the casing assemblies by hot pressing as the module is moved through a hot press consisting of a heated die 23 and a second die 25. Bonding between the conductive portions of the thermoelements and the various conductive plates may be facilitated either by soldering or brazing. Correct positioning of the thermoelements and insulated blocks is insured by the offset plates 5*a*, 5*b* . . . 6*a'*, 5*b'* . . . . Die 25 has a projection 27 which, during the hot pressing operation, forms an indentation or groove 29 in the cold side of the module casings immediately below each insulated block. These grooves help to provide correct positioning of the various components of the module. They also reduce stresses in the thermoelectric material which might result from differential expansion of the module during use.

Plates 5*a*, 5*b* . . ., 5*a'*, 5*b'* . . ., by contacting the conductive portions of the individual thermoelements, provide an electrical connection therebetween. In the specific embodiment illustrated, these plates constitute upper and lower grids of electrical connectors which interconnect these thermoelements in series; the circuit comprising plate 5*a*, n-type thermoelement 13*a*, plate 5*a'*, p-type thermoelement 19*a*, plate 5*b*, thermoelement 13*b*, plat 5*b'*, and so on. Insulation layer 3 insures that the components of this circuit are electrically insulated from outer sheets 7. Because of the low thermal resistance between these sheets 7 and plates 5*a*, 5*a'*, etc., heat transfer between the outer plates 7 and the individual thermoelements is enhanced. Further, because of the low electrical resistance between conductive cladding layers 11 (and similarly between layers 17) and the respective intermediate body portions of thermoelectric material of each thermoelement, the electrical resistance of this series circuit is minimized. The finished thermoelectric modules accordingly exhibit improved thermal and electrical characteristics.

It is apparent that while the method outlined above may be performed in any number of ways, it is particularly suitable to be carried out by automatic machine operations. Hence, this method renders practical the constructions of large thermoelectric generators and other thermoelectric apparatus by making possible the elimination of costly manual operations. The finished module is provided in a form which can be bonded directly to a heat exchanger, for example, without concern for electrical isolation. Moreover, the process of this invention is such that the shape of the resulting module, the ratio of insulation to thermoelectric material, and the dimensions of the thermoelements may be easily varied to meet the requirement of different applications. It is to be understood that the completed modules may be encapsulated by using a thin sheet of metal to enclose the sides or by flame-spraying techniques.

In view of the above, it will be seen that the several objects of the invention are achieved and other advantageous results attained.

As various changes could be made in the above methods and products without departing from the scope of the invention, it is intended that all matter contained in the above description and shown in the accompanying drawings be interpreted as illustrative and not in a limiting sense.

What is claimed is:

1. A method of fabricating thermoelectric modules comprising:

(a) bonding a first layer of electrical insulating material between two sheets of conductive material to form a first assembly;

(b) bonding a second layer of electrical insulating material between two sheets of conductive material to form a second assembly;

(c) removing portions of one of the conductive sheets of each of said first and second assemblies, whereby each of said assemblies includes a plurality of spaced, substantially coplanar electrically insulated conductive plates;

(d) positioning said assemblies substantially parallel to one another with the conductive plates of said assemblies in off-set facing relationship;

(e) forming a sheet of p-type thermoelectric material clad on both sides of said sheet with conductive material;

(f) segmenting said sheet to form a plurality of p-type thermoelements each having opposed surface portions of conductive material;

(g) forming a sheet of n-type thermoelectric material clad on both sides of said sheet with conductive material;

(h) segmenting said sheet of n-type thermoelectric material to form a plurality of n-type thermoelements each having opposed surface portions of conductive material;

(i) alternately placing said p-type thermoelements and said n-type thermoelements between said assemblies, said off-set relationship of said assemblies allowing one end of each of said thermoelements to be in contact with a conductive plate of one of said assemblies and a second end of each of said assemblies to be in contact with a conductive plate of the other assembly, whereby said thermoelements are electrically connected in series;

(j) positioning blocks of insulating material between said assemblies, whereby said alternately placed p and n-type thermoelements are insulated from each other; and (k) bonding said blocks of insulating material, said p-type thermoelements and said n-type thermoelements between said assemblies by hot pressing said assemblies.

2. The method according to claim 1 wherein said hot pressing is done between a pair of dies, at least one of which includes a projection for forming indentations in one of said assemblies contiguous said insulating blocks.

References Cited by the Examiner

UNITED STATES PATENTS

| | | | |
|---|---|---|---|
| 2,752,662 | 7/1956 | Crooks. | |
| 2,994,203 | 8/1961 | Lackey | 29—155.5 |
| 3,000,092 | 9/1961 | Scuro | 29—472.9 |

| | | | |
|---|---|---|---|
| 3,006,979 | 10/1961 | Rich | 136—4 |
| 3,076,051 | 1/1963 | Haba | 136—4 |
| 3,088,989 | 5/1963 | Lipkis | 136—4 |
| 3,126,616 | 3/1964 | Pietsch | 29—155.5 |

JOHN F. CAMPBELL, *Primary Examiner.*

ALLEN B. CURTIS, *Examiner.*

W. I. BROOKS, *Assistant Examiner.*